United States Patent [19]

Lindberg

[11] Patent Number: 4,760,335
[45] Date of Patent: Jul. 26, 1988

[54] LARGE SCALE INTEGRATED CIRCUIT TEST SYSTEM

[75] Inventor: Frank A. Lindberg, Baltimore, Md.

[73] Assignee: Westinghouse Electric Corp., Pittsburgh, Pa.

[21] Appl. No.: 760,386

[22] Filed: Jul. 30, 1985

[51] Int. Cl.[4] .................. H01R 13/62; G01R 31/26
[52] U.S. Cl. ................. 324/158 F; 361/400; 439/68; 439/74
[58] Field of Search .............. 174/52 FP, 138 G; 339/17 C, 17 CF, 75 M, 75 MP; 206/331; 361/400, 403; 324/158 F

[56] References Cited

U.S. PATENT DOCUMENTS

| | | | |
|---|---|---|---|
| 3,335,327 | 8/1967 | Damon et al. | 324/158 F |
| 3,469,684 | 9/1969 | Keady et al. | 206/331 X |
| 3,568,129 | 3/1971 | Gold et al. | 324/158 F X |
| 3,597,660 | 8/1971 | Jensen | 361/398 |
| 3,984,620 | 10/1976 | Robillard et al. | 324/158 F X |
| 4,018,491 | 4/1977 | Niedzwiecke et al. | 339/17 CF X |
| 4,065,717 | 12/1977 | Kattner et al. | 324/158 P |
| 4,194,800 | 3/1980 | Chow | 339/17 CF |
| 4,255,003 | 3/1981 | Berg | 339/17 CF X |
| 4,390,220 | 6/1983 | Benasutti | 339/75 M |
| 4,402,561 | 9/1983 | Grabbe et al. | 339/17 CF |
| 4,449,770 | 5/1984 | Grabbe et al. | 339/75 MP X |
| 4,468,074 | 8/1984 | Gordon | 339/75 M |
| 4,482,781 | 11/1984 | Burns | 174/52 FP |
| 4,568,796 | 2/1986 | Lebailly et al. | 339/17 CF X |
| 4,658,330 | 4/1987 | Berg | 361/398 X |

FOREIGN PATENT DOCUMENTS 2130383  4/1984  United Kingdom ........... 339/17 CF

Primary Examiner—Reinhard J. Eisenzopf
Assistant Examiner—Stephen M. Baker
Attorney, Agent, or Firm—W. G. Sutcliff

[57] ABSTRACT

A large scale integrated circuit package and test assembly wherein a chip is mounted on an insulating package substrate, and the package substrate is easily demountably connectable on a circuit test board. An alignment and electrical connector member bridges between the substrate conductors and the printed circuit board conductors. An elastomeric member is aligned over the alignment and electrical connector and compressed by a cover plate to make the electrical connection between the substrate and the printed circuit board. A plurality of such circuit package can be mounted upon a large area test board, and each of the individual circuit packages can be tested during system analysis.

6 Claims, 4 Drawing Sheets

LARGE SCALE INTEGRATED CIRCUIT TEST SYSTEM

GOVERNMENT CONTRACT

The Department of the Air Force has rights in this invention by virtue of the work done under Air Force Contract F33615-81-C-1532.

BACKGROUND OF THE INVENTION

The present invention relates to means for interconnecting high lead count very large scale integrated circuit packages to the conductors of a printed circuit test board. More specifically, the present invention relates to techniques for demountably connecting the integrated circuit packages to the conductors of the circuit board without the use of soldering or of lead forming operations or other such conventional interconnection techniques.

Incorporation of very high speed integrated circuit (VHSIC) chips into modern military electronic systems presents several major printed circuit board level packaging problems. Each printed circuit board will have mounted thereon a large number of VHSIC packages, each of which has a very high lead count, with by way of example as many as 140 packages mounted on a single circuit board with each package having a lead count ranging from 42 to 224. Such high density packaging and associated lead counts generally utilize a multi-layer board to minimize the total area of the board. The packages themselves have closely spaced leads typically about 0.020 inch center to center, which makes the leads difficult to solder onto the board and very difficult to remove for rework or repair. A second problem that such high lead count packages present is in routing the conductors for such a multi-layer board. At least in the initial system development stages, there are invariably changes in the routing, and circuit design changes made after the printed circuit board has been completed. A large board with many such packaged components becomes a very valuable piece of work in progress and only a limited number of board repairs are possible because of the package density with a limited number of circuit track cuts and jumpers utilized to effect circuit changes. It is not uncommon for a partially tested large board with many such circuit packages and changed circuit patterns with many cuts and jumpers affecting the circuit changes to be shifted to a new board which must be routed incorporating all of the changes in all of the components which must be unsoldered from the initial test board and put onto the new board.

U.S. Pat. No. 4,164,033 teaches an integrated circuit package and connector for demountably attaching that package to a printed circuit board panel. The connector includes a base receptacle mounted on the printed circuit board panel for receiving the integrated circuit package, so that microstrip leads on the package are registered with the terminal pads provided on the PC board. The circuit package is also provided with a flexible microstrip terminal which serves to electrically interconnect the leads to the internal circuitry of the chip mounted within the package.

An improved package is desired for large scale integrated circuit chip mounting which permits readily demountable connection of the package to the printed circuit board for test of either the packaged chip individually or of the multi-package system within which the package is one component.

SUMMARY OF THE INVENTION

A large scale integrated circuit package which is easily installed and removed from a printed circuit board for testing and trouble shooting. The integrated circuit package comprises an insulating package substrate upon which is mounted the integrated circuit chip having a plurality of chip leads extending therefrom. The package leads are aligned with and connected to a plurality of closely spaced peripherally extending conductive substrate leads disposed upon the substrate. An alignment and electrical connection means, which mates with the conductive substrate leads, comprises an insulating support member having a plurality of closely spaced conductors supported thereon, which conductors are aligned and mated with the substrate conductive leads. A plurality of alignment apertures are provided in the alignment and electrical connection means to ensure mating electrical connection. The alignment means also facilitates mounting of the electrical connection means upon a printed circuit board means upon which the substrate and alignment electrical connection means are mounted. The printed circuit board means includes a plurality of alignment pins extending toward and fitting within the alignment apertures of the connection means. The printed circuit board includes a pattern of printed circuit leads disposed on the top surface of the board upon which the substrate is mounted. The printed circuit board leads extend inwardly toward a central printed circuit board portion upon which the substrate is mounted. The inwardly extending portions of the printed circuit board leads to closely spaced and aligned for overlapping connection to the connection mean conductors, with the printed circuit board leads including peripherally extending portions which fan out to spaced-apart conductor connection posts. An elastomeric member is disposed above the aligned and overlapping printed circuit board leads and the connection means conductors. A cover plate means overlaps the substrate upon the printed circuit board and includes means for mounting the cover plate on the printed circuit board while compressing the elastomeric member to make electrical connection between the printed circuit board leads and the connection means conductors.

The large scale integrated circuit package is mountable upon a large area printed circuit test board having a plurality of electrical connector means disposed upon one side of the test board. At least one such integrated circuit package, and preferably a plurality are demountably connected upon the large area of printed circuit test board. The test board has a plurality of electrical connector means extending through the test board permitting ready interconnection and test operation of the large scale integrated circuit package demountably connected upon the test board.

DESCRIPTION OF THE PREFERRED EMBODIMENTS

Figure 1:
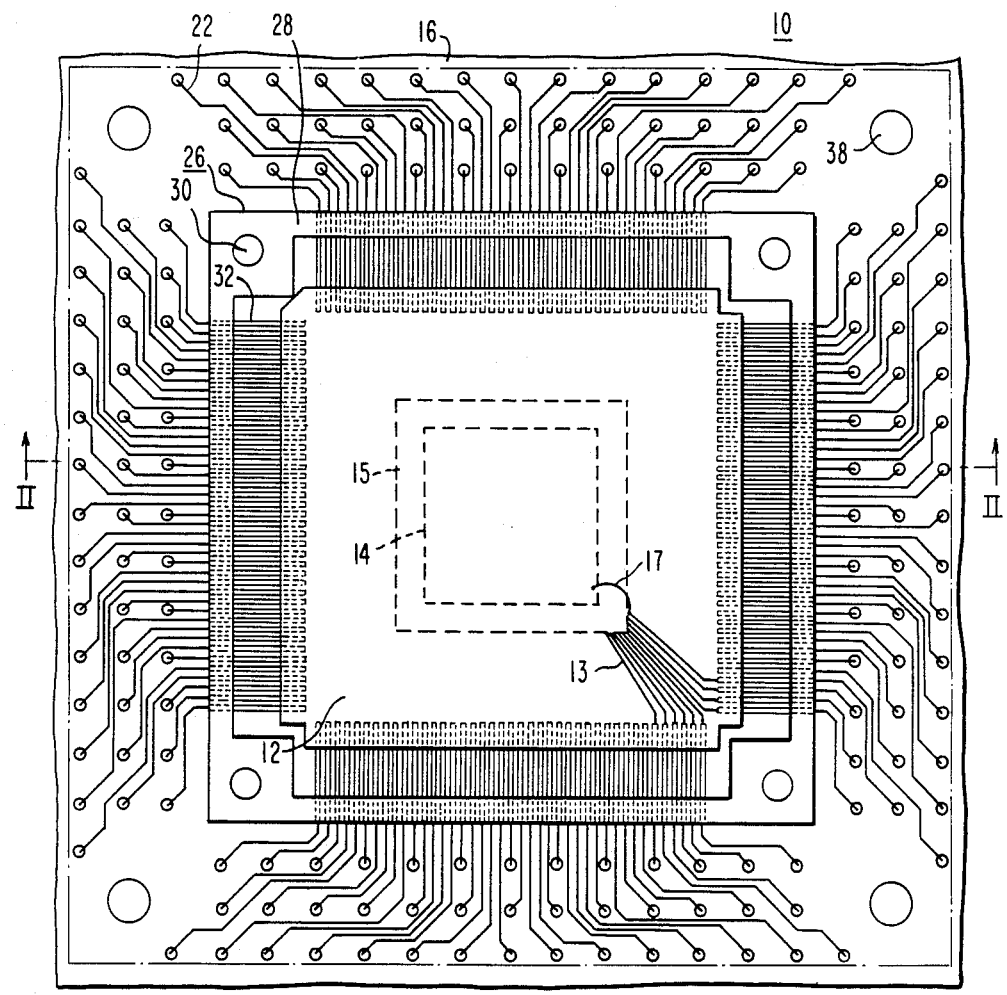
FIG. 1 is a plan view of a large scale integrated circuit package of the present invention shown mounted upon a printed circuit test board, with the package cover removed but indicated in outline form, and with the integrated circuit chip also indicated in outline form at the center of the package.
Figure 2:
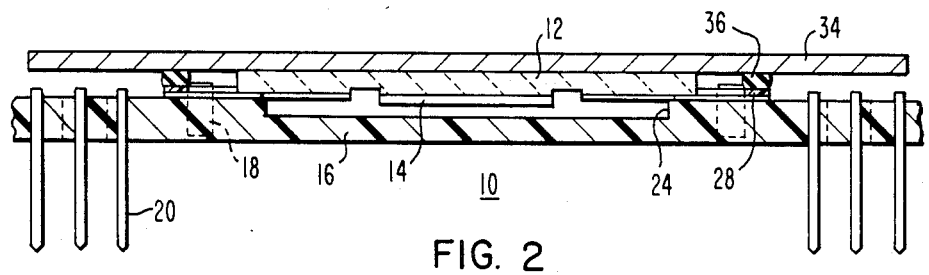
FIG. 2 is a sectional view taken along line II—II of the assembly of FIG. 1.

The invention can be best understood by reference to the drawings wherein in FIGS. 1 and 2, the large scale integrated circuit package 10 comprises a ceramic or other insulating package substrate 12 upon which an integrated circuit chip 14 shown in outline form on FIG. 1 is mounted within a central rectangular recess 15. The integrated circuit chip leads are electrically connected in conventional fashion as by wire bonds 17 to a conductor pattern 13 disposed upon the ceramic substrate 12. This conductor pattern 13 on the ceramic substrate 12 extends outwardly from the centrally disposed chip toward the periphery of the substrate 12. The substrate 12 is mounted upon printed circuit board 16 with a plurality of alignment pins 18 extending upwardly therefrom and also has a plurality of electrical test connectors 20 extending through the printed circuit board permitting ready insertion into wire-wrap interconnection sockets to enable and test operation of the large scale integrated circuit package. These test connectors 20 are individually respectively connected to printed circuit conductors 22 which are disposed upon printed circuit board 16, and which fan out from a central recessed portion 24 of the printed circuit board which accepts the chip mounted package substrate 12 for making electrical interconnection from the package substrate conductors 13 to the printed circuit board conductors 22.

An alignment and an electrical connection means 26 is disposed upon the chip package leads 32 to effect interconnection between the printed circuit board conductors 22 and the package leads 32. This alignment and electrical connection means 26 comprises a polyimide window frame 28 which has alignment apertures 30 etched in each of the four corners of the polyimide window frame 28. These alignment apertures accept the alignment pins 18 extending from the top of the printed circuit board. The plurality of closely spaced conductors 32 are held together by the polyimide window frame 28. These conductors 32 are formed by etching at the same time that the four registration apertures 30 are etched so that the tolerance between the conductor lead pattern and the registration apertures is very exact being of the order of ±0.0001 inch.

Figure 3:
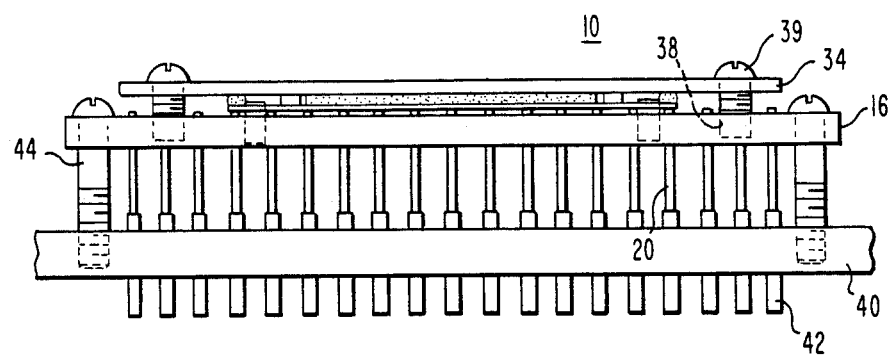
FIG. 3 is a side elevation view of the assembly of FIG. 1 mounted upon a second printed circuit test board having wire wrapped connector pins extending therethrough.

The alignment pins 18 and alignment apertures 30 into which the pins are fitted ensure accurate overlapping registration of the leads 32 with the printed circuit board conductor patterns 22. The polyimide window frame 28 is semitransparent and an optical inspection can be made during package assembly to determine if the leads 32 are in fact aligned with and overlap the individual conductors 22 on printed circuit board, and also to see if any foreign particles have become lodged on the printed circuit board which might cause shorting. The package assembler can take steps to align the conductor patterns before the package is fixed in place. A cover means 34 is demountably connectable to the printed circuit board 16. The cover means 34 has an elastomeric window frame means 36 mounted on the underside of the cover means 34, with the elastomeric window frame 36 having the same dimensions as the polyimide window frame 28. Elastomeric frame 36 is substantially thicker, however, than the polyimide window frame 28. Four mounting apertures 38 seen in FIG. 3 are provided in the printed circuit board and accept hold-down screws 39 which extend through the cover 34 engaging the threaded apertures 38 until the cover means 34 bottoms out against the substrate 12 and is in contact with substrate 12 acting as a heat sink. As the cover means 34 is tightened down, the elastomeric window frame 36 compresses and squeezes the leads 32 against the printed circuit board conductors 22 completing electrical contact therebetween.

Figure 4:
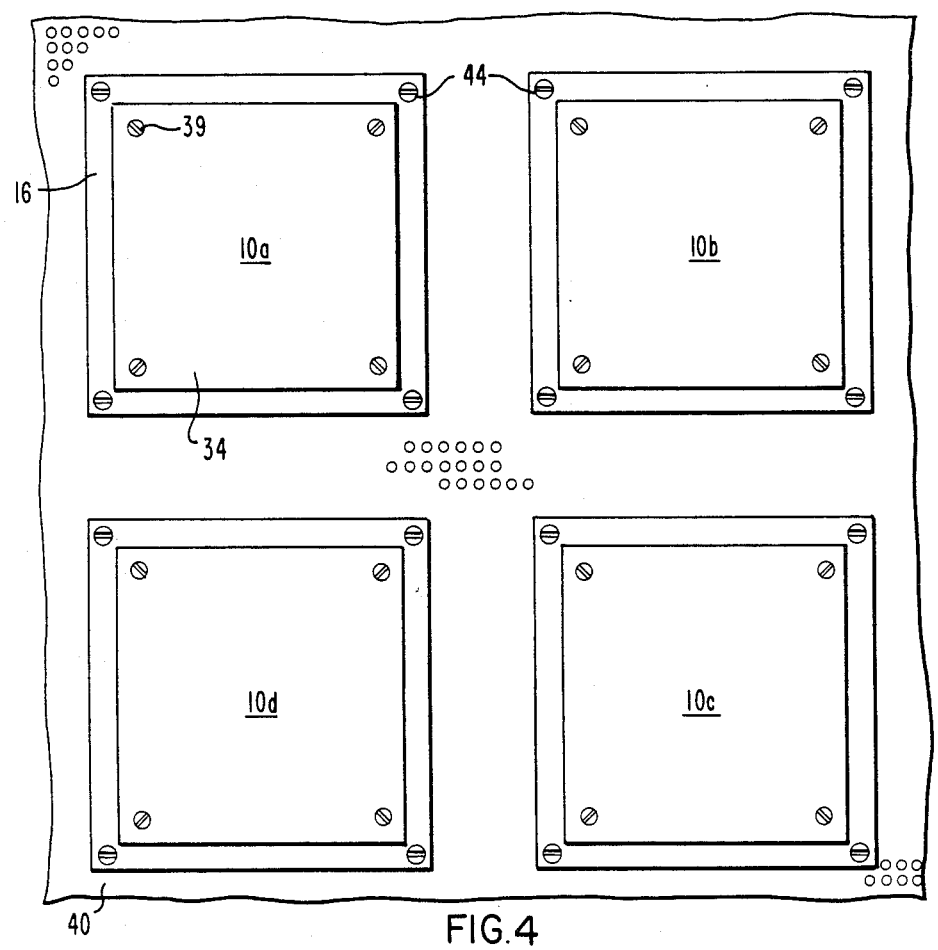
FIG. 4 is a plan view showing a plurality of the integrated circuit packages and mating adaptor boards seen in FIG. 1 mounted upon a large area wire wrap test board.

FIG. 3 illustrates mounting of the integrated circuit package of the present invention described in FIGS. 1 and 2 upon a further enlarged area wire wrap board test assembly. The large area wire wrap board test assembly 40 has a plurality of electrical connector receptacles 42 extending therethrough which receive the connector pins 20 extending from the printed circuit board means 16 of the package 10. In this embodiment, a plurality of screw mounting means 44 extend through apertues provided in the periphery of printed circuit boards 16 and are screw threaded engaged in the large area board test assembly 40. In this way, a single large scale integrated circuit package assembly of the present invention can be tested in a larger system such as illustrated in FIG. 4 wherein a plurality of large scale integrated test circuit packages 10a, 10b, 10c, 10d are shown disposed upon a large area printed circuit board 40.

Figure 5:
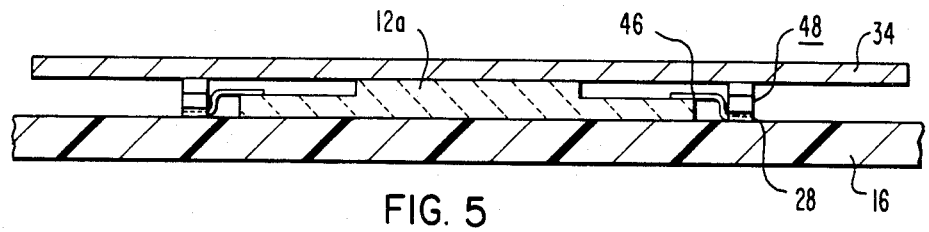
FIG. 5 is a sectional view of an alternate embodiment integrated circuit package of the present invention in which a chip up mounting scheme with S-shaped electrical leads extend from the chip support substrate to the printed circuit test board.
Figure 6:
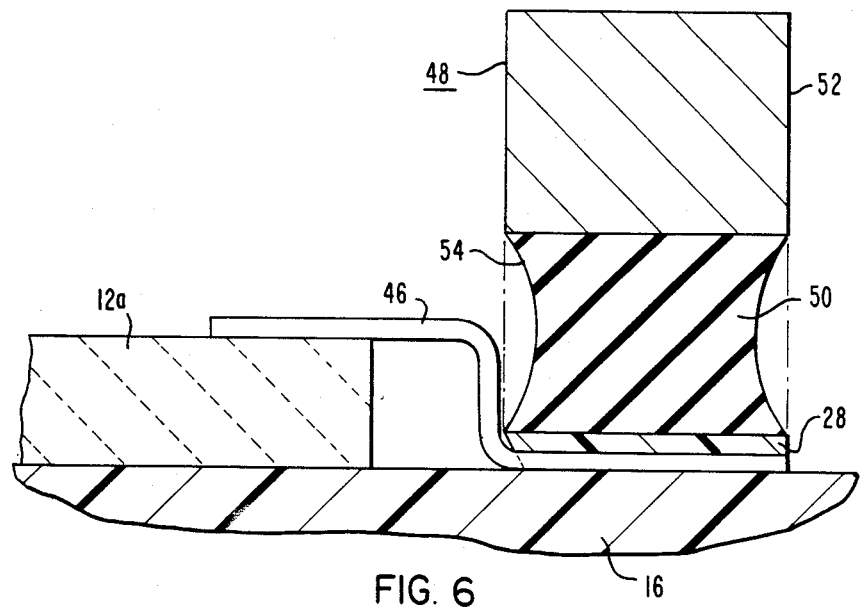
FIG. 6 illustrates in a highly enlarged sectional view the S-shaped electrical lead structure and compressible means for ensuring demountable electrical connection of such leads with the conductors on the large area printed circuit test board.

FIG. 5 illustrates an alternate embodiment large scale integrated circuit package of the present invention which is similar to the package 10 described with respect to FIGS. 1 and 2. The embodiment seen in FIG. 5 differs only from the package 10 of FIGS. 1 and 2 in that the integrated circuit chip is mounted in a chip-up mounting arrangement upon the substrate 12a. This chip-up mounting scheme requires a plurality of S-shaped electrical leads 46 extending from the conductor pattern upon the substrate 12a to the conductor pattern on the printed circuit board 16. FIG. 6 illustrates in greatly enlarged fashion the S-shaped electrical connector means 46 extending between the substrate conductor pattern and the printed circuit board. The polyimide frame 28 is seen disposed upon the printed circuit board 16 and retaining the plurality of S-shaped electrical conductors 46 for presentment thereon. In this embodiment, a compressible frame means 48 extends from the underside of the cover 34 and comprises a highly compressible lower portion 50 which is bonded to a relatively rigid or metallic upper portion 52. Undercut sidewalls 54 are provided in the compressible lower portion 50 to ensure that as the means 48 is compressed, when the cover 34 is tightened down that the compressible portion 50 will not interfere with the S-shaped conductor leads 46.

Figure 7:
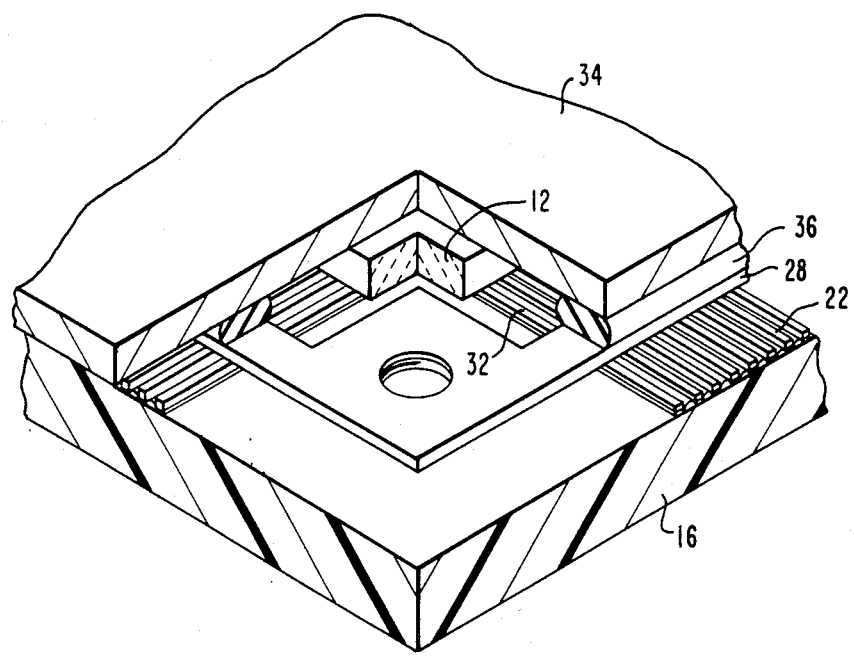
FIG. 7 is a partial isometric view of a corner of the assembly seen in FIGS. 1 and 2.

FIG. 7 is a partial isometric view of a corner of the assembly of FIGS. 1 and 2 and illustrates the printed circuit board 16 with a conductor pattern 22 thereon with polyimide window frame 28 and conductor leads 32 extending from the printed circuit board conductors 22 to the substrate 12. The cover plate 34 is seen atop the package assembly with elastomeric frame 36 disposed upon the polyimide frame 28.

Figure 8:
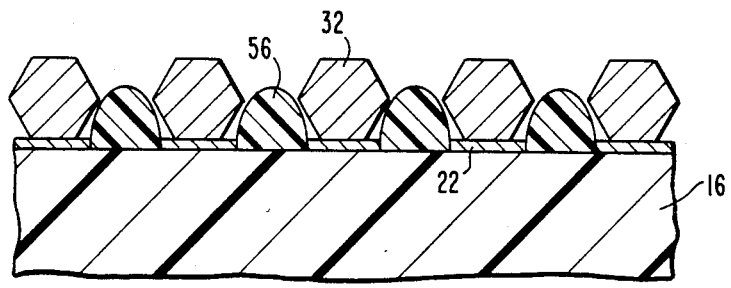
FIG. 8 is a greatly enlarged partial sectional view of the test board and conductor pattern thereon seen in the assembly of FIG. 7.

FIG. 8 is a greatly enlarged partial sectional view of area where the conductors 32 are aligned upon and make electrical contact with the conductors 22 upon the printed circuit board 16. In this embodiment insulating alignment bumps 56 are disposed between conductors 22 upon the printed circuit board 16 to facilitate alignment and overlapping contact of the conductors 32 upon conductors 22.

I claim:

1. In combination, a large scale integrated circuit package which comprises:

a package substrate upon which is mounted an integrated circuit chip having a plurality of chip connection means extending therefrom which are aligned with and connected to a plurality of closely spaced peripherally extending substrate conductors disposed upon the package substrate;

an alignment and electrical connection means comprising a thin, planar, insulating, rectangular frame member which is generally coplanar with said package substrate, with a plurality of thin closely spaced package leads supported by and extending inwardly and outwardly from said rectangular frame member, with the inwardly extending package lead ends being aligned and matingly overlapped with said package substrate conductors, and with the outwardly extending package lead ends being aligned with and matingly overlapped with printed circuit conductors on a printed circuit board upon which said package substrate and said alignment and electrical connection means are mounted, with a plurality of alignment apertures provided in said alignment and electrical connection means;

said printed circuit board upon which said package substrate and alignment and electrical connection means are mounted includes a plurality of alignment pins extending toward and fitting within the alignment apertures of said connection means, which printed circuit board includes a pattern of printed circuit conductors disposed on the top surface of the board upon which said package substrate is mounted, which printed circuit board conductors extend inwardly toward a central printed circuit borad portion upon which said package substrate is mounted, with the printed circuit board conductors including peripherally extending portions which fan out to spaced-apart conductor connection posts which extend vertically through the printed circuit board extending from the underside of said printed circuit board for electrical connection of the chip package;

an elastomeric member disposed above the aligned and matingly overlapped printed circuit board conductors and said package leads;

and a cover plate means overlaying said package substrate upon said printed circuit board with means for mounting the cover plate upon said printed circuit board while compressing said elastomeric member to make electrical contact between said printed circuit board conductors and said substrate conductors through said package leads.

2. The combination set forth in claim 1, wherein a central portion of the printed circuit board is recessed to accept therein the integrated circuit chip mounted inversely upon the package substrate, with substantially planar package leads.

3. The combination set forth in claim 1, wherein the substrate is ceramic, and the cover plate compresses the elastomeric member until the cover plate contacts the ceramic substrate and serves as a heat sink.

4. The combination set forth in claim 1, wherein the printed circuit board has a planar top surface, and the integrated circuit chip is mounted right-side-up on the substrate, with the package leads being non-planar S-shaped formed leads.

5. The combination set forth in claim 1, wherein said insulating, rectangular frame member is semitransparent permitting optical alignment of said package leads with said package substrate conductors and said printed circuit board conductors before mounting the cover plate member over said package substrate.

6. A large scale integrated circuit system test assembly in which at least one large scale integrated circuit package is demountably electrically connected to conductors on a large area circuit test board comprising:

(a) said large area circuit test board having a plurality of electrical connector means disposed upon one side of said test board for demountably connecting to electrical leads from a plurality of large scale integrated circuit packages, which electrical connector means extend through said test board as a plurality of electrical test connectors permitting ready interconnection and test operation of the circuit packages demountably connected on the test board;

(b) at least one integrated circuit chip package demountably mounted upon said test board, said chip package comprising:

(1) a package substrate upon which is mounted an integrated circuit chip having a plurality of chip connection means extending therefrom which are aligned with and connected to a plurality of closely spaced peripherally extending substrate conductors disposed upon said package substrate.

(2) an alignment and electrical connection means comprising a thin, planar, insulating, rectangular frame member which is generally coplanar with said package substrate, with a plurality of thin closely spaced package leads supported by and extending inwardly and outwardly from said rectangular frame member, with the inwardly extending package lead ends being aligned and matingly overlapped with said package substrate conductor, and with the outwardly extending package lead ends being aligned with and matingly overlapped with printed circuit board conductors on a printed circuit board upon which said package substrate and said alignment and electrical connection means are mounted, with a plurality of alignment apertures provided in said alignment and electrical connection means;

(c) said printed circuit board upon which said package substrate and alignment and electrical connection means are mounted includes a plurality of alignment pins extending toward and fitting within the alignment apertures of said connection means, which printed circuit board includes a pattern of printed circuit conductors disposed on the top surface of the board upon which said package substrate is mounted, which printed circuit board conductors extend inwardly toward a central printed circuit board portion upon which said package substrate is mounted, with the printed circuit board conductors including peripherally extending portions which fan out to spaced-apart conductor connection posts which extend vertically through the printed circuit board extending from the underside of said printed circuit board for electrical connection of the chip package;

(d) an elastomeric member disposed above the aligned and matingly overlapped printed circuit board conductors and said package leads;

(e) and a cover plate means overlaying said package substrate upon said printed circuit board with means for mounting the cover plate upon said printed circuit board while compressing said elastomeric member to make electrical contact between said printed circuit board conductors and said substrate conductors through said package leads.

* * * * *